US008168957B2

(12) United States Patent
Keller et al.

(10) Patent No.: US 8,168,957 B2
(45) Date of Patent: *May 1, 2012

(54) MAGNETICALLY ENHANCED, INDUCTIVELY COUPLED PLASMA SOURCE FOR A FOCUSED ION BEAM SYSTEM

(75) Inventors: John Keller, Newburgh, NY (US); Noel Smith, Lake Oswego, OR (US); Roderick Boswell, O'Connor (AU); Lawrence Scipioni, Beaverton, OR (US); Christine Charles, O'Connor (AU); Orson Sutherland, Evatt (AU)

(73) Assignee: FEI Company, Hillsboro, OR (US)

( * ) Notice: Subject to any disclaimer, the term of this patent is extended or adjusted under 35 U.S.C. 154(b) by 96 days.

This patent is subject to a terminal disclaimer.

(21) Appl. No.: 12/704,123

(22) Filed: Feb. 11, 2010

(65) Prior Publication Data

US 2010/0294648 A1    Nov. 25, 2010

Related U.S. Application Data

(63) Continuation of application No. 11/825,136, filed on Jul. 2, 2007, now Pat. No. 7,670,455, which is a continuation of application No. 10/988,745, filed on Nov. 13, 2004, now Pat. No. 7,241,361.

(60) Provisional application No. 60/546,142, filed on Feb. 20, 2004.

(51) Int. Cl.
*H01J 49/10* (2006.01)
*H01J 27/02* (2006.01)

(52) U.S. Cl. ............... 250/423 R; 250/424; 250/492.21; 315/111.81; 315/111.21; 356/316; 156/345.48

(58) Field of Classification Search .............. 250/423 R, 250/424, 492.21; 315/111.81, 111.21; 156/345.48; 356/316
See application file for complete search history.

(56) References Cited

U.S. PATENT DOCUMENTS

| 4,362,632 A | 12/1982 | Jacob |
| 4,503,329 A | 3/1985 | Yamaguchi et al. |
| 4,859,908 A | 8/1989 | Yoshida et al. |
| 4,870,284 A | 9/1989 | Hashimoto et al. |
| 5,008,537 A | 4/1991 | Toita et al. |
| 5,036,252 A | 7/1991 | Lob |
| 5,108,535 A | 4/1992 | Ono et al. |
| 5,573,595 A | 11/1996 | Dible |

(Continued)

FOREIGN PATENT DOCUMENTS
JP    4625440    7/1971
(Continued)

OTHER PUBLICATIONS

"Advanced Ceramic-to-Metal & Glass-Ceramic Sealing Technology," "Isolator," CeramTec, CeramTec North America Corporation, Presentation, www2.ceramtec.com., publication date unknown, 13 Pages.

(Continued)

*Primary Examiner* — Nikita Wells
(74) *Attorney, Agent, or Firm* — Scheinberg & Griner LLP; Michael O. Scheinberg; John Kelly

(57) ABSTRACT

The present invention provides an inductively coupled, magnetically enhanced ion beam source, suitable to be used in conjunction with probe-forming optics to produce an ion beam without kinetic energy oscillations induced by the source.

22 Claims, 5 Drawing Sheets

U.S. PATENT DOCUMENTS

| | | | |
|---|---|---|---|
| 5,614,711 | A | 3/1997 | Li et al. |
| 5,686,796 | A | 11/1997 | Boswell et al. |
| 5,945,677 | A | 8/1999 | Leung et al. |
| 5,965,034 | A | 10/1999 | Vinogradov et al. |
| 6,127,275 | A | 10/2000 | Flamm |
| 6,239,404 | B1 | 5/2001 | Lea et al. |
| 6,768,120 | B2 | 7/2004 | Leung et al. |
| 6,770,836 | B2 | 8/2004 | Kwon et al. |
| 6,833,051 | B2 | 12/2004 | Kazumi et al. |
| 6,858,112 | B2 * | 2/2005 | Flamm et al. ............ 156/345.48 |
| 6,975,072 | B2 | 12/2005 | Leung et al. |
| 7,084,407 | B2 | 8/2006 | Ji et al. |
| 7,176,469 | B2 * | 2/2007 | Leung et al. ............. 250/423 R |
| 7,241,361 | B2 * | 7/2007 | Keller et al. ............ 156/345.48 |
| 7,670,455 | B2 * | 3/2010 | Keller et al. ............ 156/345.48 |
| 2006/0272775 | A1 | 12/2006 | Horsky et al. |
| 2007/0108395 | A1 | 5/2007 | Horsky et al. |
| 2009/0309018 | A1 | 12/2009 | Smith et al. |

FOREIGN PATENT DOCUMENTS

| | | |
|---|---|---|
| JP | 03-272549 | 12/1991 |
| JP | 06176725 | 6/1994 |
| JP | H06176728 | 6/1994 |
| JP | 07312201 | 11/1995 |
| JP | 07335163 | 12/1995 |
| JP | 2000-133497 | 5/2000 |
| WO | 2005038821 | 4/2005 |

OTHER PUBLICATIONS

Coath, C.D. et al.,"A High-Brightness Duoplasmatron Ion Source for Microprobe Secondary-Ion Mass Spectrometry," Rev. Sci. Instrum., American Institute of Physics, Feb. 1995, pp. 1018-1023, vol. 66(2).
Coupland, J.R. et al., "A Study of the Ion Beam Intensity and Divergence Obtained from a Single Aperture Three Electrode Extraction System," Rev. Sci. Instrum., Sep. 1973, pp. 1258-1270, vol. 44, No. 9.
Daykin, P.N., "Electrode shapes for cylindrical electron beam," British Journal of Applied Physics, Jul. 1955, pp. 248-250, vol. 6.
Harrison, E.R., "Approximate electrode shapes for a cylindrical electron beam," British Journal of Applied Physics, Jan. 1954, pp. 40-41, vol. 5.
Hayes, A.V. et al., "Recent Advances in Veeco's Radio Frequency Ion Sources for Ion Beam Materials Processing Applications (Abstract)," Review of Scientific Instruments, Feb. 2002, 1 Page, vol. 73, No. 2.
Hopwood, J., "A Microfabricated Inductively-Coupled Plasma Generator," Journal of Microelectromachanical Systems, Sep. 2000, pp. 309-313, vol. 9, Issue 3.
IMG-31/IGPS Microwave Ion Source/Power Supply, Kimball Physics, Inc., http://web.archive.org/web/20000209181820/http://www.kimballphysics.com/, www.kimballphysics.com, Feb. 9, 2000, retrieved Aug. 19, 2009.
Iwai, H. et al., "A Study of Charge Compensation for Insulator Samples in AES by Low Energy Ion Beam Irradiation," J. Surf. Anal., 1999, pp. 161-164 (1-4), vol. 5, No. 1.
Ji, Q. et al., "Development of Focused Ion Beam Systems with Various Ion Species," Nuclear Instruments and Methods in Physics Research, 2005, pp. 335-340, vol. B 241.
Jiang, X. et al., "Mini RF-Driven Ion Sources for Focused Ion Bean Systems," Review of Scientific Instruments, American Institute of Physics, Apr. 2003, pp. 2288-2292, vol. 74, No. 4.
Johnson, W., "Electrostatically-Shielded Inductively-Coupled RF Plasma Sources," High Density Plasma Sources, 1995, pp. 100-148, Chapter 3.
Keller, R., "Ion Extraction," The Physics and Technology of Ion Sources, Ian G. Brown (Ed.), 1991, pp. 23-51, Chapter 3, Jon Wiley & Sons, New York.
Leung, Ka-Ngo, "Radio-Frequency Driven Ion Sources," The Physics and Technology of Ion Sources, Ian G. Brown (Ed.), 2004, pp. 163-175, Second Edition.
Lieberman, M.A. et al., "Principles of Plasma Discharges and Materials Processing," John Wiley & Sons, New York, 1994, 1st Edition, pp. 31-37, pp. 157-163.
Mordyk, S. et al., "High-Plasma-Density Helicon Source for Ion Beam Application," Institute of Applied Physics, National Academy of Sciences of the Ukraine, 4 Pages, Sumy, Ukraine, publication date unknown.
Nabhiraj, P.Y. et al., "Design of High Current RF Ion Source for Micromachining Applications," Raja Ramanna Centre for Advanced Technology (RRCAT), APAC 2007, pp. 262-264, Indore, India.
Xe Sputter Yields, National Physical Laboratory (NPL), Crown Copyright 2005, May 12, 2005, 6 Pages.
Okada, K. et al., "Diagnostics of Low Pressure Inductively Coupled VHF Plasma Used for Nanostructured Carbon Deposition," 28th ICPIG, Jul. 15-20, 2007, pp. 1566-1567, Prague, Czech Republic.
"Plasma Controller," Oxford Scientific Instruments for Innovators, Oxford Scientific, Ltd. (now Specs, 2006), www.oxsci.com, http://www.specs.de/cms/front_content.php?idcat=209.
Panagopoulos, T. et al., "Plasma Sheath Model and Ion Energy Distribution for All Radio Frequencies," Journal of Applied Physics, Apr. 1, 1999, pp. 3435-3443, vol. 85, No. 7.
"Corporate Brochure," RFVII website, Download Brochure, http://www.rfvii.com/, publication date unknown, retrieved Aug. 19, 2009.
"Singletron Accelerator Systems," High Voltage Engineering, Company Brochure, http://www.highvolteng.com/media/Brochures/Singletron_broch.pdf, publication date unknown, retrieved Aug. 19, 2009.
Smith, Noel,"SIMS Instrumentation" and "Ion Guns," Noel Smith's Thesis, Excerpt, Chapters 3.3 and 3.3.1, 6 Pages.
Smith, Noel,"High Brightness Inductively Coupled Plasma Source for High Current Focused Ion Beam," J. Vac. Sci. Technol., Nov./Dec. 2006, pp. 2902-2906, vol. 24(6).
Smith, Noel et al., "A High Brightness Source for Nano-Probe Secondary Ion Mass Spectrometry,"Applied Surface Science, Dec. 15, 2008, pp. 1606-1609, vol. 255, Issue 4.
Sobolewski, M. et al., "Measurements and Modeling of Ion Energy Distributions in High-Density, Radio-Frequency Biased CF4 Discharges," Journal of Applied Physics, May 15, 2002, pp. 6303-6314, vol. 91, No. 10.
Speth, E. et al., "Overview of RF Source Development at IPP," CCNB-Meeting at Padua, Jun. 5-6, 2003, 29 Pages, Padua.
Vargas-Aburto, C. et al., "Development of a Quadrupole-Based Secondary-Ion Mass Spectrometry (SIMS) System at Lewis Research Center," NASA Technical Memorandum 102531, Jun. 1990, 36 Pages.
Wagenaars, E., "Plasma Breakdown of Low-Pressure Gas Discharges," Excerpt from Erik Wagenaars' Thesis, 2006, Chapter 1.2, pp. 6-7.
Wang, Y. et al.,"Ion Energy Distributions in Inductively Coupled Radio-Frequency Discharges in Argon, Nitrogen, Oxygen, Chlorine, and Their Mixtures," Journal of Applied Physics, May 1, 1999, pp. 6358-6365, vol. 85, No. 9.
Welton, R.F., "Ion Sources R&D at the SNS," Accelerator Physics and Technology Seminar, Jan. 19, 2006, pp. 1-32.
Welton, R.F., "Ion Sources R&D at the SNS," Accelerator Physics and Technology Forum, Oct. 13, 2005, pp. 1-27.
Welton, R.F. et al., "Advanced RF-Driven H- Ion Sources at the SNS," Proceedings of PAC07, UT-Batelle, LLC, U.S. Department of Energy, T01 Proton and Ion Sources, 2007, pp. 3774-3776, FROAAB02, Albuquerque, New Mexico.
Whitlock, Bill, "Shields, Grounds and Microphone Cables," Rycote Microphone Winshields, Ltd., Chris Wolf (Ed.), 2004, pp. 1-6.
Wituschek, H. et al., "Investigation of Extraction Systems with Low Aberrations," Rev. Sci. Instrum., Apr. 1992, pp. 2785-2787, vol. 63(4).
Yin, Y. et al., "Miniaturization of Inductively Coupled Plasma Sources," Plasma Science, Oct. 1999, pp. 1516-1524, vol. 27, Issue 5.

* cited by examiner

MAGNETICALLY ENHANCED, INDUCTIVELY COUPLED PLASMA SOURCE FOR A FOCUSED ION BEAM SYSTEM

This application is a Continuation application of U.S. patent application Ser. No. 11/825,136, filed Jul. 2, 2007, which is a Continuation of U.S. patent application Ser. No. 10/988,745, filed Nov. 13, 2004, and issued as U.S. Pat. No. 7,241,361, which claims priority from U.S. Provisional Pat. App. 60/546,142, filed Feb. 20, 2004, all of which are hereby incorporated by reference.

TECHNICAL FIELD OF THE INVENTION

The present invention relates to the field of focused ion beam systems.

BACKGROUND OF THE INVENTION

Focused ion beam (FIB) systems are widely used in characterization or treatment of materials on microscopic to nanoscopic scales. For example, focused ion beam systems are used in manufacturing operations because of their ability to image, mill, deposit and analyze with great precision. Ion columns in FIB systems using gallium liquid metal ion sources (LMIS), for example, can provide five to seven nanometers of lateral resolution. Such focused ion beam systems are commercially available, for example, from FEI Company, Hillsboro, Oreg., the assignee of the present application. Although use of liquid metal ion sources has increased, their application is often limited due to metal ion contamination and relatively low obtainable beam currents. Lower beam currents result in lower erosion rates and hence longer processing times in production applications and in laboratories.

In contrast to FIB systems are broad ion beam systems suitable for semiconductor processing on a relatively large scale. For example, a broad beam system may be used for semiconductor doping over nearly the entire surface of a silicon substrate wafer. RF sources have been used for large-area wafer processing. For such uses no probe forming optics are employed.

A challenge exists in generating high current, low energy beams for implantation from an RF plasma source. A complication associated with using an RF driven ion source for low energy ion implantation is the undesirable oscillations imparted to the plasma potential, through capacitive coupling from the antenna to the plasma. The plasma potential can have peak-to-peak oscillations of several hundred volts, thereby dramatically modulating the extracted beam energy. Such a highly modulated beam is unsuitable for low energy ion implantation, due to the broadened projected ion range into the target.

Ion energy modulation is even less suitable for FIB systems, due to the associated chromatic aberrations generated in the beam. The relationship between the energy spread due to RF modulation of the beam and the chromatic blur of the beam is given by:

$$d_c = \frac{\Delta E}{E_0} C_c \alpha_i \quad (1)$$

where, $d_c$ is the diameter of the chromatic disc, $C_c$ is the chromatic aberration coefficient for the optical system and $\alpha_i$ is the convergence half-angle of the beam as it forms the focused spot at the target. $E_o$ is the energy to which the ions are accelerated by the extraction optics. The term $\Delta E$ is the energy spread that results from modulations in the plasma potential due to capacitive coupling from the antenna, coupled with the fundamental axial energy spread of ions from the source that is determined by the potential gradient in the pre-sheath region of the plasma. Clearly, the modulations imparted by the RF source substantially and undesirably impact the focus of the beam. At least partially for this reason, it is believed that RF sources have not been successfully used with FIB systems.

For precision milling and deposition, one desires high beam current for faster production times, focused into a small spot. Hence, high source brightness and minimal optical aberrations are required. The "brightness" of a beam from a plasma source is proportional to the beam current density from the source and inversely proportional to the mean thermal ion energy for ions existing in the plasma. This is expressed by the equation (2):

$$\beta_{max} = \frac{J_i E_0}{\pi E_\perp} \quad (2)$$

Here $\beta_{max}$ is the beam brightness assuming zero aberrations introduced from the extraction optics, $J_i$ is the current density extracted from the plasma, Eo is the energy to which the ions are accelerated by the extraction optics, and $E_\perp$ is the mean thermal ion energy. Clearly, beam brightness increases when the current density is increased and the mean thermal ion energy is decreased.

The current density, $J_i$, is given by:

$$J_i = 0.6 n_i q \sqrt{k_B T_e / M_i} \quad (3)$$

where, ($n_i$) is the plasma ion density, ($T_e$) is the mean electron energy within the plasma, (q) is the fundamental unit of charge, ($k_B$) is Boltzmann's constant, and ($M_i$) is the mass of the ion in the plasma. Clearly, current density is increased by increasing the plasma ion density and increasing the mean electron energy in the plasma. Hence, for the values indicated above, the optimum $\alpha_i$ is determined to be ~7.5 mrads, resulting in an image side brightness of ~7×10³ A cm⁻² sr⁻¹ and a source brightness of ~1.5×10⁴ A cm⁻² sr⁻¹ at 20 keV.

To summarize, we want high current density and low thermal energy to obtain high beam brightness. To achieve high current density, we want high plasma ion density and high mean electron energy. What is needed, therefore, is a high-density focused plasma ion beam system with low thermal ion energies to facilitate high brightness.

SUMMARY OF THE INVENTION

The present invention provides a method for forming a plasma that is suitable as a high brightness ion source. The plasma is inductively coupled to a compensated RF antenna and can be used in conjunction with focusing optics to produce a focused ion beam for milling and deposition. According to an aspect of the present invention, the RF antenna can be implemented as a helical coil that surrounds a plasma tube. An RF current source is applied to the antenna to induce ionization of the plasma gas in the tube. An impedance matching circuit is provided to allow efficient power transfer to the plasma with appropriate phase shift across the antenna to eliminate plasma potential modulation. The ionized plasma is extracted into an ion beam and focused by ion optics. The ion beam so formed is substantially free of undesirable energy oscillations arising from the RF antenna. Because the RF source imparts only small or ideally no oscillations to the plasma potential, the consequent axial energy spread of the beam arising there from is small. Hence, the ionizing source does not cause substantial chromatic aberration. Moreover, the RF source imparts to the plasma a high ion density. When coupled with focusing mechanisms, the high-density beam is highly suitable for milling and deposition.

The foregoing has rather broadly outlined features and technical advantages of the present invention in order that the detailed description of the invention that follows may be better understood. Additional features and advantages of the invention will be described hereinafter. It should be appreciated by those skilled in the art that the conception and specific embodiment disclosed herein may be readily utilized as a basis for modifying or designing other structures for carrying out many useful purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
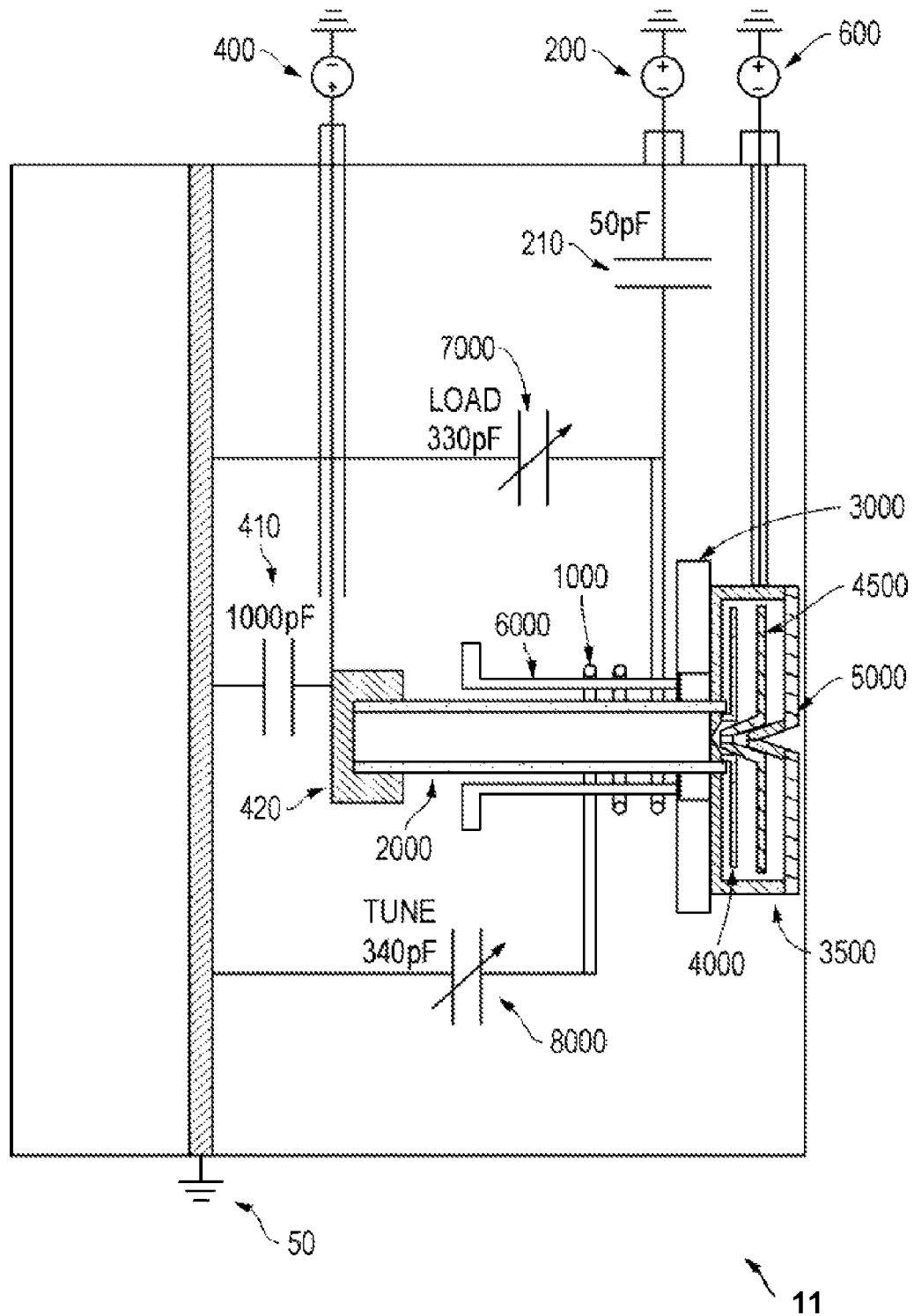
FIG. 1 shows a preferred embodiment of an ion plasma source according to the method of the present invention.

FIG. 1 shows a diagram of an embodiment of an ion plasma source 11 according to the method of the present invention. A coil 1000 is capacitively coupled by impedance 210 to an RF source 200. Note that the capacitances shown in FIG. 1 are nominal values that readily can be selected by one of skill in the art according to the frequency of operation of the coil, as will be described further below. Coil 1000 is preferably a multi-turn coil that wraps around a dielectric plasma tube 2000 so that the axis of the coil substantially coincides with the axis of chamber 2000 and the beam axis.

When driven by source 200, coil 1000 forms a helical RF antenna. Driving the coil with an RF source can impart a time-varying potential to the plasma, due to capacitive coupling. That is, the coil can produce a radial electric field that modulates the plasma. This is undesirable because it creates a spread in the beam energy, resulting in chromatic aberration. However, in a preferred embodiment of the present invention, the antenna is driven at one end by a signal that is out of phase with the signal at the opposite end by as much as 180°. This creates a region interior to the coil where the potential fluctuations are substantially zero at all times. In this region there is substantially no time-varying modulation of the plasma arising from the time-varying voltage across the coil 1000. Thus, the phase of the antenna can be adjusted to minimize modulation of the ionization potential of the plasma in the region where ions are extracted in response to an applied acceleration field. The energy of the ions extracted from the plasma, according to this method, is substantially un-modulated by the RF voltage across the antenna.

However, source 200 does indeed cause electrons to move. Because of the orientation of the coil, free electrons in the plasma circulate around the plasma skin, causing them to collide with atoms to produce ions. This can produce plasma of very high ion density with relatively low thermal ion energy. A fixed-strength annular magnet about 5 to 10 millimeters thick, or a variable-strength electromagnet 3000, that produces an axial field strength of nominally 200 to 1000 Gauss is placed between an end of the coil and a region 3500 of extraction, and is provided to increase plasma density. The magnet reduces electron diffusion and loss to the walls of the plasma chamber. Thus, the RF source is inductively coupled to the plasma, and the annular magnet increases the plasma density in the extraction region.

A split Faraday shield 6000 can be used to screen out the capacitive field of the coil, but this is less desirable for two main reasons. First, a degree of capacitive coupling is required to ignite the plasma. Using a split Faraday shield usually requires another external power source (e.g., a Tesla coil) to ignite the plasma. Second, split Faraday shields typically result in some energy loss, due to Eddy currents induced in the shield. Without the Faraday shield, the balanced antenna approach still results in a sufficient time varying electric field in areas of the plasma chamber to cause the initial field ionization required to initiate the plasma.

A beam voltage 400 is electrically connected to a beam energy cap 420, which has an additional low pass filter 410 to ensure negligible RF pick-up to the beam voltage. An extractor voltage source 600, that is negative with respect to the potential applied to the source electrode 4000, is applied to the extraction electrode 4500. Skimmer electrode 5000 is at ground potential and provides an aperture through which the dense ion beam passes to produce an ion beam that can be focused with appropriate optics. Thus, the beam is extracted from the extraction region 3500, with a beam waist formed in the skimmer aperture 5000, and thus propagates along the beam axis in response to an applied acceleration. Alternatively, beam voltage 400 can be electrically connected directly to the source electrode 4000 instead of to the beam energy cap 420.

Note that the configuration of electrodes in the extraction region shown in FIG. 1 is representative, but other electrode configurations could be implemented instead. Indeed, the invention contemplates that extraction optics generating a collimated or divergent beam will be optimum, as opposed to forming a waist in the beam. Essentially, extraction optics that result in the least emittance growth and minimal Coulomb interactions are the most favorable for a high brightness ion source.

Figure 2:
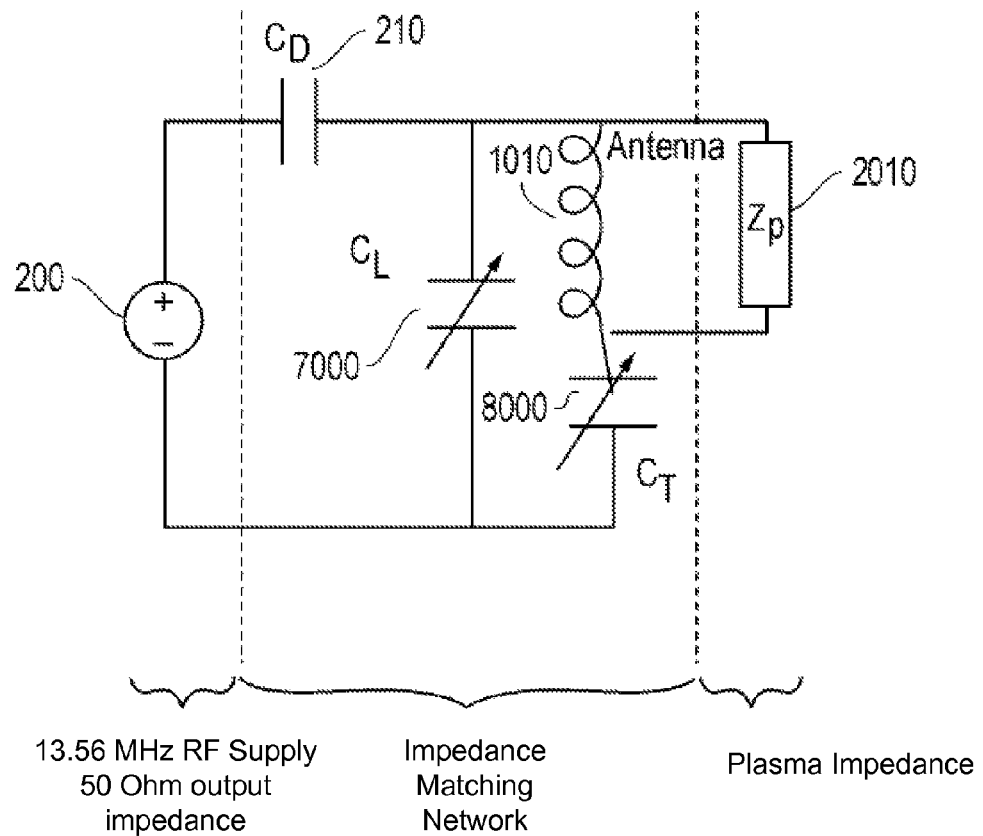
FIG. 2 shows a circuit for adjustment of power transfer to the plasma.

FIG. 2 shows a circuit of the present invention, including a plasma impedance, $Z_p$, 2010 in parallel with an unknown coil inductance characteristic 1010. In series with the parallel combination of the plasma impedance 2010 and inductance 1010 is capacitance 8000. This series-parallel combination is in parallel with a second capacitance 7000. This parallel-series-parallel combination is in series with a third capacitance 210. This entire network is in parallel with the source 200. Clearly, the phase shift across the coil and plasma impedance can be controlled by the selection of capacitance values 210, 7000 and 8000. One can therefore select capacitance values 210, 7000, and 8000 to obtain a phase shift across the coil and plasma of 180 degrees.

Suppose for example that the source is at 13.56 Mega-Hertz (MHz) with a 50 ohm output impedance. Then choosing the following capacitances results in a phase shift across the coil and plasma of about 180 degrees: capacitance 210=50 pico-Farads (pF), capacitance 7000=330 pF, capacitance 8000=340 pF. The combined components—capacitances 210, 7000, and 8000, and inductance 1010—may be viewed as an impedance matching network that matches the 50 ohm source impedance to the plasma impedance 2010 load. When the network is matched, maximum power from the source is transferred to the plasma impedance load. These values were implemented for an Argon plasma tube with an inner diameter of 20 milli-meters (mm), an outer diameter of 26 mm, and a length of 100 mm. The wall of the plasma tube was 3 mm-thick quartz. The coil was 30 mm long with three turns and a diameter of about 50 mm.

Figure 3:
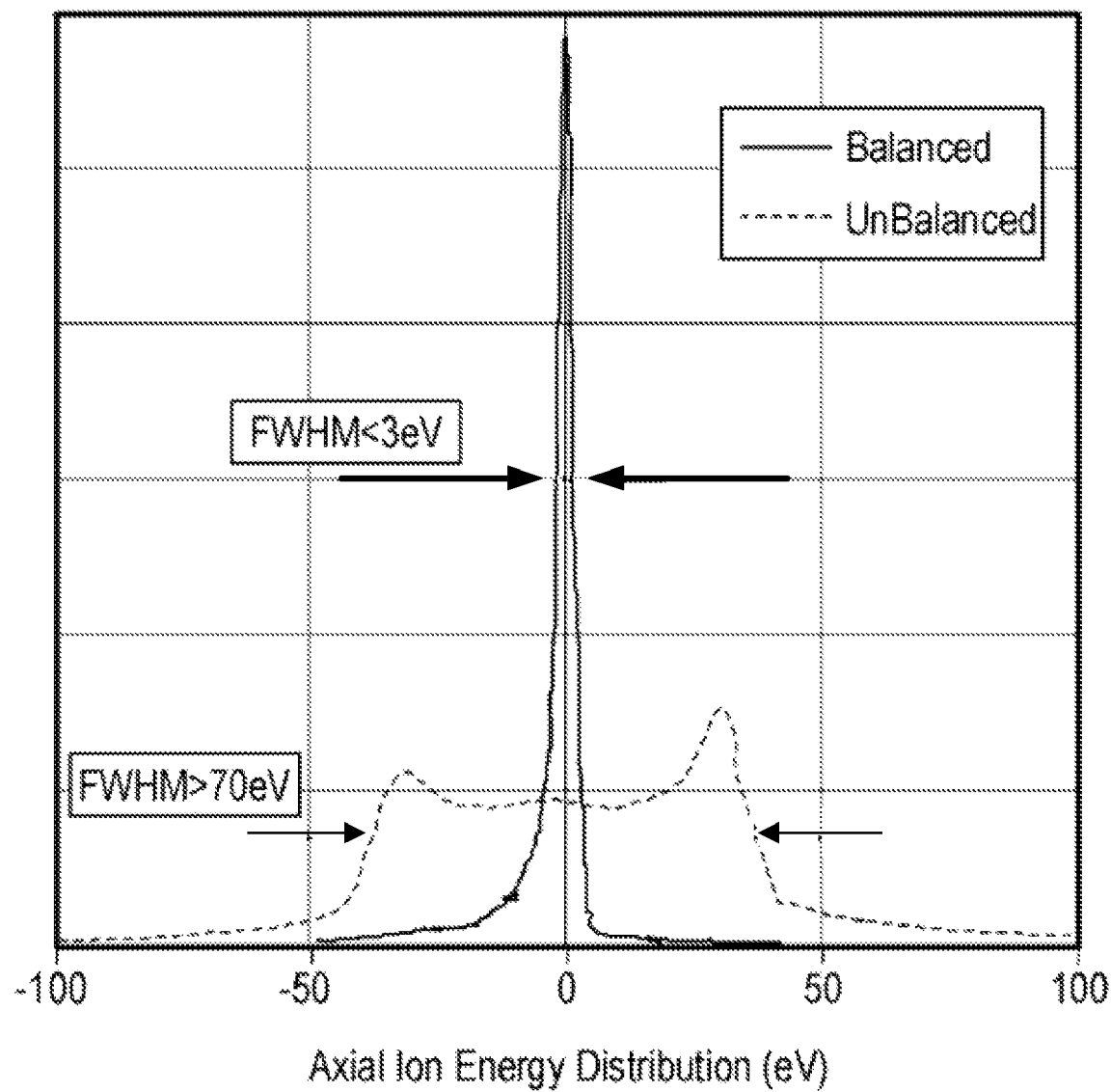
FIG. 3 shows the axial energy spread data for this invention.

Thus, the present invention provides a circuit adjustment to achieve a maximum transfer of power to the plasma, coupled with negligible modulation of the plasma potential, resulting in negligible axial energy spread of the extracted ions. FIG. 3 shows a graph of the axial ion energy distribution resulting from the antenna in a balanced state and an unbalanced state. When the antenna is in the balanced state, that is, when the phase shift across the antenna is about 180 degrees, then the axial ion energy is very narrowly distributed about zero electron-Volts (eV). This is shown by the solid curve in FIG. 3, which exhibits a full width at half magnitude of less than 3 eV. In contrast, when the antenna is unbalanced, the axial ion energy is distributed over a broad energy range. This is shown by the dashed curve in FIG. 3, which exhibits a full width at half maximum of greater than 70 eV.

The embodiment described above minimizes the effects of capacitive coupling on the ions, leaving only the influence of the pre-sheath potential gradient. The potential gradient of the pre-sheath region is finite, but small, and is generally about half the mean electron energy ($T_e$), where $T_e$ is only 3 eV for the type of source described above, giving an inescapable lower limit to the axial energy spread ($\Delta E$) of ~1.5 eV.

The present invention may be conveniently operated at low RF power, nominally imparting 25 Watts to the plasma. At this power level a brightness of ~200 $Acm^{-2}sr^{-1}$ (Amperes/centimeter-squared/steradian) can be generated at only 5 keV with an ion current density of 19.6 mA $cm^{-2}$. This implies a thermal energy of $\leq 0.15$ eV and a plasma density of ~$8 \times 10^{11}$ $cm^{-3}$. Pulse plasma densities of $1 \times 10^{14}$ ions $cm^{-3}$ have been attained with this source, implying that a source brightness of >$1 \times 10^5$ A $cm^{-2}$ $sr^{-1}$ is obtainable at a beam energy of 50 keV, with current density of: $J_i = 0.6 n_i q \sqrt{k_B T_e / M_i} \sim 2.4$ $Acm^{-2}$, where $E_0$=50 keV, and $E_\perp$=0.15 eV. This yields $$\beta_{max} = \frac{J_i E_0}{\pi E_\perp} > 1 \times 10^5 A \ cm^{-2} sr^{-1}.$$

Figure 4:
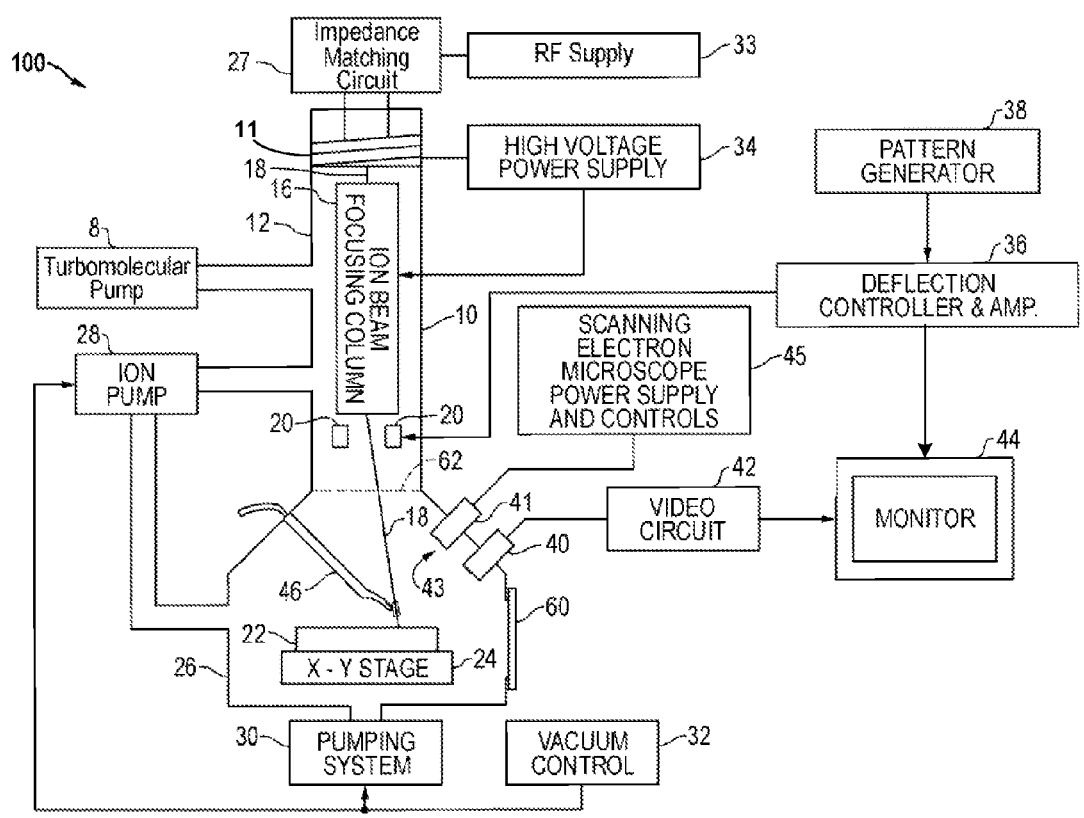
FIG. 4 shows a preferred embodiment of the present invention.

FIG. 4 shows a focused ion beam system 100 that includes an evacuated envelope 10 upon which is located a plasma source 11 with an RF antenna, implemented as described above, to provide a dense plasma for ion beam focusing column 16. Ion beam 18 passes from source 11 through column optics 16 and between electrostatic deflection mechanism 20 toward specimen 22, which comprises, for example, a semiconductor device positioned on movable X-Y stage 24 within lower chamber 26. A turbo-molecular pump 8 is employed for evacuating the source and maintaining high vacuum in the upper column optics region. The vacuum system provides within chamber 26 a vacuum of typically between approximately $1 \times 10$-7 Torr and $5 \times 10$-4 Torr, with nominally 10 mTorr in the plasma source and <$1 \times 10$-6 Torr in the column optics chamber.

High voltage power 34 is connected to ion source 11 as well as to appropriate electrodes in focusing column 16 for forming an approximately 0.1 keV to 50 keV ion beam 18 and directing the same downward. RF power supply 33 and impedance matching circuit 27 is also provided to energize a coil of source 11, as described above. Deflection controller and amplifier 36, operated in accordance with a prescribed pattern provided by pattern generator 38, is coupled to deflection plates 20 whereby beam 18 may be controlled to trace out a corresponding pattern on the upper surface of specimen 22. In some systems, the deflection plates are placed before the final lens, as is well known in the art.

The ion beam source 11 is brought to a focus at specimen 22 for either modifying the surface 22 by ion milling, material deposition, or for the purpose of imaging the surface 22. A charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a preferred charged particle multiplier 40 can be coaxial with the ion beam and include a hole for allowing the ion beam to pass. A scanning electron microscope 41, along with its power supply and controls 45, are optionally provided with the FIB system 100.

Signals applied to deflection controller and amplifier 36, cause the focused ion beam to move within a target area to be imaged or milled according to a pattern controlled by pattern generator 38. Emissions from each sample point are collected by charged particle multiplier 40 to create an image that is displayed on video monitor 44 by way of video circuit 42. An operator viewing the image may adjust the voltages applied to various optical elements in column 16 to focus the beam and adjust the beam for various aberrations.

Focusing optics in column 16 may comprise mechanisms known in the art for focusing or methods to be developed in the future. For example, two cylindrically symmetric electrostatic lenses can be implemented to produce a demagnified image of the round virtual source. Because of the low axial energy spread in the extracted beam, chromatic blur is minimal and efficient focusing of the beam can be achieved even at low acceleration voltages (i.e. low beam energies). These properties in conjunction with appropriate focusing optics can be used to generate nanometer, to micrometer scale spot sizes with a range of kinetic energies (0.1 keV-50 keV) and beam currents from a few pico-amperes to several microamperes.

A large transfer of power from the coil to the plasma is desirable to achieve high ionization density. Hence, efficient power dissipation is required to limit the operating temperature of the plasma source. Desirably, heat is conducted away from the plasma tube efficiently. This can be achieved by forming a dielectric and metallic shell around the plasma, inside the coil, with high thermal conductivity to efficiently conduct heat away from the plasma.

The source can be expected to have a predictable and relatively long life span (i.e. >>1000 hours). This type of source differs from a DC plasma source, because ions leave the plasma and strike the surrounding walls at energies that are nominally 15-20 eV (5.2 $T_e$ for an argon plasma), resulting in negligible sputtering of source chamber material. A typical DC source has a plasma potential that is nominally 50-500 V higher than a cathodic electrode, resulting in significant sputtering of the cathode that ultimately results in the end of life for these sources. Substantial elimination of plasma potential modulation, according to the methods described herein, also substantially reduces the probability of ions striking the source electrode with energy above the sputter threshold. Ions transit the plasma sheath in a time that is substantially less than the period of the RF signal. Hence, ions leave the plasma with kinetic energies that are determined largely by the temporal plasma potential induced by the capacitive field from the antenna.

The realization of very high plasma densities (up to $10^{14}/cm^3$), low thermal ion energies (down to 0.1 eV), low axial energy spread (1.5-3 eV), the ability to operate with either inert or reactive gases, and the potential for very long life due to minimal erosion of source materials, makes a magnetically enhanced, inductively coupled plasma source ideal to be used in conjunction with probe forming FIB optics.

The present invention can provide beam currents from a few pico-amperes to current greater than $10^{-11}$, greater than $10^{-10}$ amps, greater than $10^{-9}$ amps, greater than $10^{-8}$ amps, greater than $10^{-7}$ or current of several micro-amperes. A source brightness of at least $10^4$ A/cm$^2$/sr, at least $10^5$ A/cm$^2$/sr, and up to $10^6$ A/cm$^2$/sr or more at 50 keV can be achieved. The axial energy spread is less than 3 eV, less than 2.5 and could be as low as 1.5 eV. This contrasts sharply with present day Liquid Metal Ion Sources (LMIS), which can provide a beam brightness on the order of $10^6$ A/cm$^2$/sr, but with an energy spread on the order of 5 eV. Also, LMI sources are generally only suitable for generation of beam currents in the pico- to nano-ampere range. A further advantage of the present invention is the ability to operate with any inert gas as well as many reactive gases, (e.g., $O_2$, $N_2$, $SF_6$, etc. . . . ). The ion beam from the present invention is capable of being focused into a beam diameter of a few nanometers, up to several tens of micrometers. Inert gas beams can readily be generated making the invention suitable for applications where gallium or other metallic ion beams might be problematic.

In fact, the axial energy spread is dictated only by the static potential gradient of the pre-sheath region of the plasma. Ions can be generated at any point on the pre-sheath potential gradient, with ions created at the top of the gradient ultimately acquiring more kinetic energy than those created at the bottom. The energy distribution is determined by the height of the potential hill, which is determined by the mean electron energy in the plasma ($T_e$), according to:

$$\Delta V \sim k_B T_e / 2q \quad (4)$$

With a mean electron temperature of $3.48 \times 10^4$ K (3 eV), the resulting potential drop in the pre-sheath is ~1.5V.

As a point of reference, a 100 nm diameter, 100 pA argon FIB, with a nominal landing energy of 20 keV requires an image side brightness (B) of ~7200 A cm$^{-2}$ sr$^{-1}$ according to:

$$B = \frac{4I}{\pi^2 \alpha_i^2 d^2} \quad (5)$$

with $\alpha_i$ being the convergence angle, d the spot size, and I the beam current. If an axial energy spread ($\Delta E$) of nominally 2 eV is assumed, along with a demagnifying two lens optical system having a chromatic aberration coefficient, $C_c$=86 mm and a spherical aberration coefficient, $C_s$=120 mm, the beam is chromatically dominated under the optimum conditions. Furthermore, we can assume that our beam will have equal contributions from chromatic blur and the demagnified geometric source size. Hence, the contributions from chromatic aberration disk ($d_c$) and the geometric spot size will each be ~100/$\sqrt{2}$=71 nm. Hence, for the values indicated above, the optimum $\alpha_i$ is determined to be ~7.5 mrads, resulting in an image side brightness of ~7$\times 10^3$ A cm$^{-2}$ sr$^{-1}$ and a source brightness of ~1.5$\times 10^4$ A cm$^{-2}$ sr$^{-1}$ at 20 keV.

In order to generate a source brightness of 1.5$\times 10^4$ Acm$^{-2}$ sr$^{-1}$ in an argon plasma, a magnetically enhanced Inductively Couple Plasma (ICP) source can be used. In order for this plasma source to provide a brightness of greater than 1.5$\times 10^4$ A cm$^{-2}$ sr$^{-1}$, at a nominal energy of 20 keV, a current density from the source of ~225 mA/cm$^2$ is required assuming a thermal energy of 0.1 eV, according to:

$$\beta_{max} = \frac{J_i E_0}{\pi E_\perp} \quad (6)$$

Finally, in order to achieve $J_i$=225 mA/cm$^2$ we require a plasma density of at least $9 \times 10^{12}$ ions/cm$^3$, from:

$$n_i = \frac{J_i}{0.6q\sqrt{k_B T_e / M_i}} \quad (7)$$

where $n_i$=plasma ion density (m$^{-3}$), $J_i$=2250 A m$^{-2}$, $T_e$=3.48$\times 10^4$ K, $k_B$=1.38$\times 10^{-23}$ J K$^{-1}$, q=1.6$\times 10^{-19}$ C, $M_i$=39.948$\times 1.66 \times 10^{-27}$ kg. The plasma source invention described herein provides all the necessary plasma attributes (ion density, mean thermal ion energy and axial energy spread) to result in a high brightness ion source suitable for nanometer scale FIB applications. Thus, the present invention provides a low energy spread (<3 eV) and low mean thermal ion energy (<0.15 eV) at low RF power, on the order of 25 Watts imparted to the plasma. Also, the source exhibits very high beam current stability (<0.1% drift per hour). At higher RF powers the beam brightness increases while still maintaining low thermal ion energies within the plasma to enable realization of a targeted brightness with a plasma density below that achieved in a pulsed mode.

Figure 5:
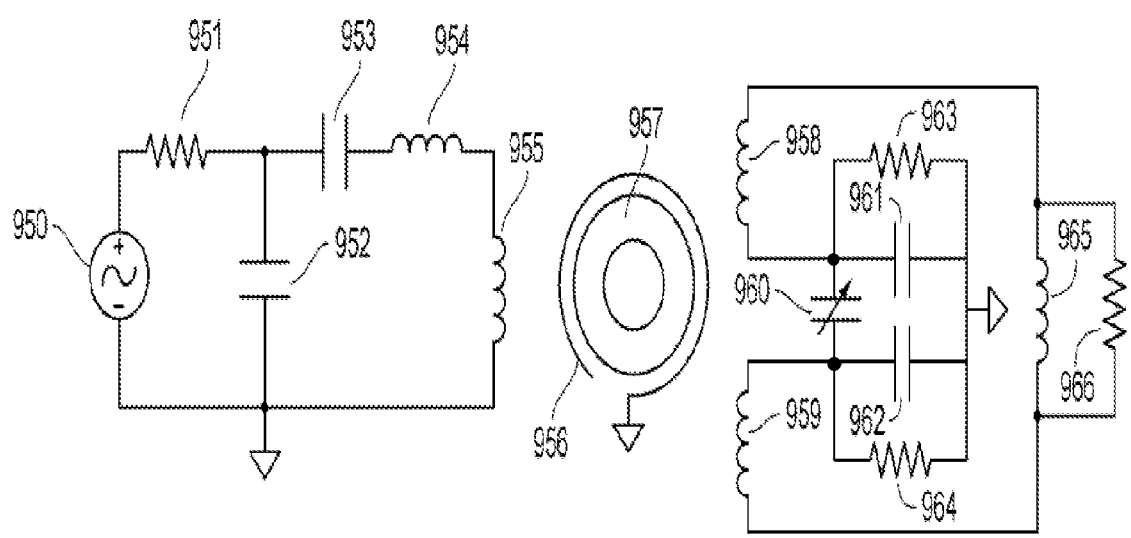
FIG. 5 shows an alternative embodiment of the present invention.

An alternative embodiment of the present invention is shown schematically in FIG. 5. An RF generator 950 is presented with a source resistance 951. This is coupled to shunt capacitance 952. A primary winding 955 wrapped around a ferrite toroidal core 957 with a Faraday shield 956 is coupled to the RF source through inductance 954 and capacitance 953. Capacitance 953 compensates for leakage inductance 954. Ferrite core 957 may be formed from two commercially available cemented-together cores wrapped with Teflon tape, each core rated at 1 kilo-Watt (kW). In a preferred embodiment, the primary winding is distributed around the toroid as copper tape. Wrapped over this is more Teflon insulation tape, followed by a Faraday shield, followed by another layer of Teflon.

There are two balanced secondary windings 958 and 959 that may be implemented as single passes of copper tape traversing through the interior of core 957. These may be held in place by the hardware of the capacitors and stand-off feed-through connectors for the antenna wires. The secondary windings are coupled together through adjustable capacitance 960 and are coupled to ground through the parallel combination of like capacitances 961 and 962 and like resistances 963 and 964. The opposite ends of the windings 958 and 959 are coupled across the parallel combination of the antenna inductance 965 and the plasma impedance 966. Values for the circuit components may be obtained from a SPICE program assuming a value for the plasma impedance.

The transformer formed by the primary and secondary windings provides an impedance transformation of one to $(T1/T2)^2$, where T1 is the number of turns in the primary and T2 is the number of turns in the secondary. This aids in transforming the low plasma impedance 966 to the 50 ohm impedance of the generator. For example, with a turns ratio of 7 to 2, the impedance transformation is one to 12.25.

The secondary is center-tapped and coupled to ground to provide a balanced circuit independent of the impedance match. The secondary windings and antenna, in conjunction with capacitances 960, 961, and 962, form a series resonant circuit. Variable capacitance 960 enables tuning of the circuit that is relatively insensitive to changes in plasma impedance. The balun leakage inductance 954 is compensated by capacitance 953, and the parallel capacitance 952 completes the match to 50 ohms. The matching provided by this embodiment is relatively insensitive to component tolerances. Moreover, the balanced circuit produces an RF field that is substantially symmetrical across the plasma length.

Although the present invention and its advantages have been described in detail, it should be understood that various changes, substitutions and alterations can be made herein without departing from the spirit and scope of the invention as defined by the appended claims. Because the invention can be used in different applications for different purposes, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for producing a focused ion beam, comprising the steps of:
   applying RF power to an antenna that inductively couples energy to a plasma to induce ionization of the plasma in proximity of the antenna;
   providing circuitry to adjust the electrical phase shift across the antenna to reduce modulation of the plasma potential;
   providing a split faraday shield between the antenna and the plasma to reduce capacitive coupling between the antenna and the plasma;
   extracting an ionized beam from a region of extraction; and
   applying a focusing mechanism to the ion beam extracted from the region.

2. The method of claim 1, further comprising the step of providing a magnet in proximity to the region of beam extraction.

3. The method of claim 2, wherein the magnet is fixed annular magnet.

4. The method of claim 2, wherein the magnet produces between 200 and 1000 Gauss.

5. The method of claim 1, wherein the circuitry is adjustable to vary an amount of power transferred to the plasma.

6. The method of claim 1, wherein the circuitry is adjustable to vary the voltage phase across the antenna.

7. The method of claim 1, wherein the coil is positioned so that an axis of the antenna substantially coincides with an axis of propagation of the extracted beam.

8. The method of claim 1, wherein the antenna is positioned to minimize modulation of the plasma potential in the region immediately adjacent to the source exit aperture.

9. A focused ion beam system, comprising:
   a vessel enclosing a region of plasma;
   an antenna excited by an RF electrical source to induce ionization of the plasma;
   circuitry that couples the antenna to the electrical source to substantially reduce RF oscillations in the ionized plasma.
   an extraction mechanism to extract the ionized plasma into a beam; and
   a focusing mechanism to focus the beam.

10. The system of claim 9, further comprising a means to dissipate heat generated in the plasma.

11. The system of claim 9, wherein the antenna comprises a single or multi-turn helical coil oriented to induce high ionization density in the plasma in a region in proximity to the coil.

12. The system of claim 9, wherein the focusing mechanism focuses the beam for milling and deposition.

13. The system of claim 9 wherein a high ion density in the plasma produces a high beam current without substantial modulation of the plasma potential and hence axial energy spread of extracted ions.

14. A focused ion beam system for milling and deposition, comprising:
   a plasma tube comprising an ionizable, non-metallic plasma gas and a source aperture at an end of the tube;
   a helical antenna positioned around the plasma tube;
   circuitry in a network comprising the antenna;
   an extractor that enables extraction of the plasma from the source aperture into a beam; and
   a focusing mechanism to focus the beam.

15. The system of claim 14, further comprising a magnet placed in proximity of the source aperture.

16. The system of claim 14, wherein the focusing mechanism causes a beam of high brightness exceeding 2000 $A/cm^2/sr$ with an extracted beam energy of 10 keV.

17. The system of claim 14, wherein the system exhibits an energy spread that is less than 3 eV.

18. The system of claim 14, wherein the system exhibits an energy spread that is less than 4 eV.

19. The system of claim 14, further comprising a transformer for coupling the RF source to the plasma.

20. The system of claim 19, wherein a secondary of the transformer is center-tapped and coupled through a circuit to ground.

21. The system of claim 9, further comprising a split faraday shield disposed between the antenna and the vessel to reduce capacitive coupling between the antenna and the plasma.

22. The system of claim 14, further comprising a split faraday shield disposed between the antenna and the plasma tube to reduce capacitive coupling between the antenna and the plasma.

* * * * *